(12) United States Patent
Hong

(10) Patent No.: US 9,543,939 B2
(45) Date of Patent: Jan. 10, 2017

(54) TRIGGER CIRCUIT AND LIGHT APPARATUS COMPRISING THE SAME

(71) Applicant: Magnachip Semiconductor, Ltd., Cheongju-si (KR)

(72) Inventor: Seung Woo Hong, Seoul (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/082,827

(22) Filed: Mar. 28, 2016

(65) Prior Publication Data

US 2016/0294380 A1 Oct. 6, 2016

(30) Foreign Application Priority Data

Mar. 30, 2015 (KR) ........................ 10-2015-0044008

(51) Int. Cl.
*H03K 17/0814* (2006.01)
*H05B 33/08* (2006.01)
*H03K 7/08* (2006.01)

(52) U.S. Cl.
CPC .......... *H03K 17/08142* (2013.01); *H03K 7/08* (2013.01); *H05B 33/0815* (2013.01)

(58) Field of Classification Search
CPC . H05B 33/0815; H05B 33/0818; H05B 37/02; H05B 37/029; H05B 41/28; Y02B 20/346; Y02B 20/347; H02M 3/156; H02M 3/33507; H03K 17/08142; H03K 7/08
USPC .. 315/291, 294, 297, 307, 224, 312; 361/56; 363/21.12
See application file for complete search history.

(56) References Cited

U.S. PATENT DOCUMENTS

| | | | |
|---|---|---|---|
| 8,248,145 B2 * | 8/2012 | Melanson | H02M 3/158 323/222 |
| 8,872,437 B2 * | 10/2014 | Esaki | H05B 37/02 315/224 |
| 9,455,629 B1 * | 9/2016 | Hong | H02M 3/156 |
| 2015/0312983 A1 * | 10/2015 | Hu | F21K 9/1355 315/186 |
| 2016/0126846 A1 * | 5/2016 | Ferrazza | H02M 3/33523 363/21.12 |
| 2016/0285365 A1 * | 9/2016 | Hong | H05B 33/0815 |

* cited by examiner

*Primary Examiner* — Haissa Philogene

(57) ABSTRACT

A trigger circuit includes a high voltage protector configured to scale down a first voltage according to an internal voltage to output a second voltage having a lower level than the first voltage, a switching trigger configured to detect that the outputted second voltage falls below a certain voltage level to provide a switching trigger signal, and a switching controller configured to provide a switching control signal for turning on a driving switching element based on the switching trigger signal.

16 Claims, 5 Drawing Sheets

TRIGGER CIRCUIT AND LIGHT APPARATUS COMPRISING THE SAME

CROSS-REFERENCE TO RELATED APPLICATION(S)

This application claims the benefit under 35 USC 119(a) of Korean Patent Application No. 10-2015-0044008 filed on Mar. 30, 2015 in the Korean Intellectual Property Office, the entire disclosure of which is incorporated herein by reference for all purposes.

BACKGROUND

1. Field

The following description relates to a driving method of a trigger circuit. The following description also relates to such a trigger circuit and a light apparatus having such a trigger circuit in order to preserve an internal element of an integrated circuit (IC) from a high voltage condition and in order to control a driving switching element.

2. Description of Related Art

A Light Emitting Diode (LED) light apparatus may be driven through a switching converter method and the switching converter may be classified according to a Buck-type, a Boost-type and a Buck-Boost-type. Here, a Buck-type converter is a voltage step down and a current step up converter, a Boost-type converter is a DC-to-DC power converter with an output voltage greater than its input voltage, and a Buck-Boost type converter is a converter that is able to operate in multiple modes, and so is able to act as a Buck-type converter or a Boost-type converter. In alternative technologies, a switching converter of the Boost-type was mostly used, but recently the Buck-type is being used for cost reduction of an integrated circuit (IC). Thus, a type of a switching converter may be classified according to a ratio of an input voltage and an output voltage, as discussed above, and may include a Metal-Oxide-Semiconductor Field Effect Transistor (MOSFET) in order to provide an average inductor current mode method.

An LED light apparatus may be driven by a high efficiency light apparatus driving circuit including a MOSFET. In such an LED light apparatus, the MOSFET may be turned on when a driving current driving an LED module reaches a zero value. Because a circuit for controlling the MOSFET requires a lower voltage than a circuit driving the LED module, the LED light apparatus may use a high breakdown voltage element for detecting a time point at which the driving current reaches a zero value. That is, an external high breakdown voltage may be used for detecting that a high voltage applied to a first terminal of the MOSFET rapidly falls. However, the alternative technology uses the high breakdown voltage, which potentially causes a cost competitiveness issue.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a trigger circuit includes a high voltage protector configured to scale down a first voltage according to an internal voltage to output a second voltage having a lower level than the first voltage, a switching trigger configured to detect that the outputted second voltage falls below a certain voltage level to provide a switching trigger signal, and a switching controller configured to provide a switching control signal for turning on a driving switching element in response to receiving the switching trigger signal.

The high voltage protector may include a high voltage protection element configured to be electrically connected with a first input terminal of the switching trigger and configured to output the second voltage based on the internal voltage.

The high voltage protector may include a Metal-Insulator-Metal (MIM) capacitor configured to receive an external voltage through a terminal to provide the first voltage to the high voltage protection element through another terminal, wherein at least a portion of the MIM capacitor is formed on an upper part of the high voltage protection element.

The MIM capacitor may cut off a direct current (DC) component of the external voltage and provides the first voltage to correspond to an alternating current (AC) component of the external voltage to the high voltage protection element.

The high voltage protector may include a voltage distribution module configured to distribute the second voltage to generate a third voltage and configured to provide the generated third voltage to the first input terminal of the switching trigger, wherein at least a portion of the voltage distribution module is formed on the upper part of the high voltage protection element.

The high voltage protection element may locate at least a portion of the MIM capacitor to one side of the upper part of the high voltage protection element and at least a portion of the voltage distribution module to the other side of the high voltage protection element.

The switching trigger may provide the switching trigger signal to correspond to an edge clock to turn on the driving switching element in response to the third voltage falling below a reference voltage.

The trigger circuit may further include a pulse width controller configured to provide a pulse width control signal for controlling a pulse width of the switching control signal at a turn-off point of the driving switching element.

The switching controller may provide the switching control signal for turning off the driving switching element based on the pulse width control signal.

The driving switching element may be turned off using a voltage mode pulse-width modulation (PWM) control method or a current mode PWM control method.

The switching controller may include a storage element configured to provide an output value for turning on or turning off the driving switching element based on an output variance time of the switching trigger or the pulse width controller.

In another general aspect, a light emitting diode light apparatus includes a Light Emitting Diode (LED) module, an inductor connected in series to the LED module, a driving switching element connected in series to the inductor, and a trigger circuit configured to scale down an external voltage generated through a driving current driving the LED module to turn on the driving switching element when the scaled down voltage falls below a certain voltage, wherein the trigger circuit comprises: a high voltage protector configured to scale down a first voltage according to an internal voltage to output a second voltage lower than the first voltage level, a switching trigger configured to detect that the outputted second voltage falls below a certain voltage to provide a switching trigger signal, and a switching controller configured to provide a switching control signal for turning on a driving switching element based on the switching trigger signal.

In another general aspect, a driving method of a trigger circuit includes scaling down a first voltage according to an internal voltage to output a second voltage having a lower level than the first voltage, detecting that the outputted second voltage falls below a certain voltage level to provide a switching trigger signal, and providing a switching control signal for turning on a driving switching element based on the switching trigger signal.

The driving method may further include providing a pulse width control signal for controlling a pulse width of the switching control signal at a turn-off point of the driving switching element.

The switching control signal for turning off the driving switching element may be provided based on the pulse width control signal.

The driving switching element may be turned off using a voltage mode pulse-width modulation (PWM) control method or a current mode PWM control method.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
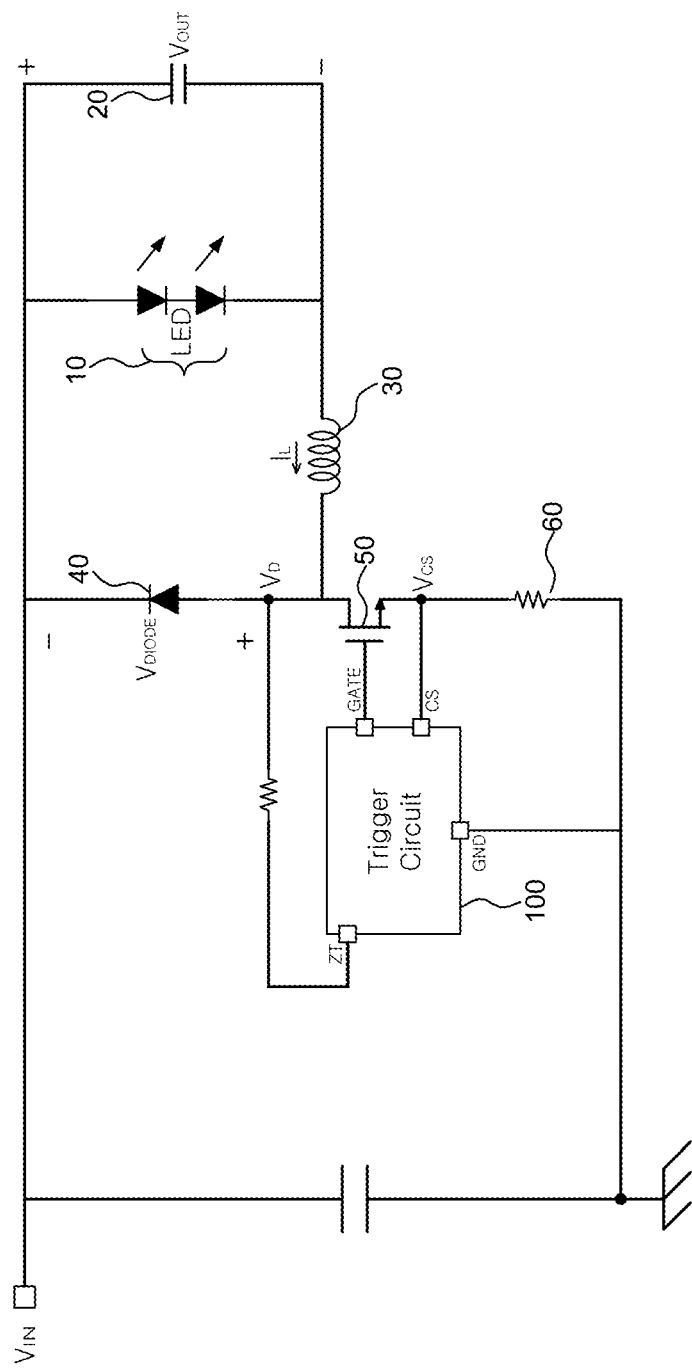
FIG. 1 is a circuit diagram illustrating a trigger circuit and light apparatus having the same according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While terms such as "first," "second," and the like, are used to describe various components, such components are not to be understood as being limited to the terms. The terms are merely used to help the reader to distinguish one component from another.

It is to be understood that when an element is referred to as being "connected to" or "connected with" another element, the element is possibly directly connected to the other element or intervening elements are also possibly present. In addition, unless explicitly described to the contrary, the word "comprise" and variations such as "comprises" or "comprising," or synonyms such as "including" or "having," are to be understood to imply the inclusion of stated elements but not the exclusion of any other elements. Meanwhile, other expressions describing relationships between components such as "between", "immediately between" or "adjacent to" and "directly adjacent to" are to be construed similarly.

Singular forms "a", "an" and "the" in the present disclosure are intended to include the plural forms as well, unless the context clearly indicates otherwise.

Devices that are in communication with each other are not required be in continuous communication with each other, unless expressly specified otherwise. In addition, devices that are in communication with each other possibly communicate directly with one another or indirectly through one or more intermediary devices.

Although process steps, method steps, algorithms, or the like, are described in a certain sequential order, such processes, methods and algorithms are potentially configured to work in appropriate alternate orders. In other words, any sequence or order of steps that is described does not necessarily indicate a requirement that the steps be performed in that order. Accordingly, the steps of the processes, methods or algorithms described herein are able to be performed in any order practical. Additionally, some steps may be performed simultaneously.

When a single device or article is described herein, it is to be readily apparent that more than one device or article is possibly used in place of a single device or article. Similarly, where more than one device or article is described herein, it is to be readily apparent that a single device or article is possibly used in place of the more than one device or article. Also, the functionality or the features of a device are alternatively embodied by one or more other devices that are not explicitly described as having all or some of such functionality or features.

According to one embodiment, a trigger circuit and light apparatus having the same use a Metal-Insulator-Metal (MIM) capacitor and a high voltage protection element to protect an internal element of an integrated circuit (IC) from a high voltage.

According to one embodiment, a trigger circuit and light apparatus having the same use a MIM (Metal-Insulator-Metal) capacitor and a high voltage protection element to detect a time point that a driving current reaches a zero value.

According to one embodiment, a trigger circuit and light apparatus having the same use a MIM (Metal-Insulator-Metal) capacitor and a high voltage protection element to improve cost competitiveness.

FIG. 1 is a circuit diagram illustrating a trigger circuit and light apparatus having the same according to an embodiment.

Referring to the embodiment of FIG. 1, the light emitting diode light apparatus includes an LED module 10, an output capacitor 20, an inductor 30, a diode 40, a driving switching element 50, a sensing resistance 60 and a trigger circuit 100.

For example, the light emitting diode light apparatus is provided with an input voltage $V_{IN}$ from an input power supply. That is, the input power supply corresponds to a source of the input voltage $V_{IN}$. In various embodiments, an input voltage $V_{IN}$ may correspond to a DC voltage $V_{DC}$ or an AC voltage $V_{AC}$. In an embodiment, when the input voltage $V_{IN}$ corresponds to the DC voltage $V_{DC}$, the input power supply provides a stable DC power supply $V_{DC}$. Alternatively, when the input voltage $V_{IN}$ corresponds to the AC voltage $V_{AC}$, the frequency of the AC input voltage $V_{IN}$ possibly corresponds to, 50 Hz or 60 Hz according to an electric power provider, but the frequency of the AC input voltage is not limited to these examples and other frequencies are possible in other embodiments.

In one embodiment, the light emitting diode light apparatus is driven through a switching converter method. In some embodiments, the light emitting diode light apparatus is embodied as a Buck-type converter, but is not necessarily limited to such a converter, so in other embodiments, the light emitting diode apparatus is embodied as a Boost-type converter or a Buck-Boost-type converter.

The LED module 10 is formed into n groups, where n is a natural number. For example, the groups are arranged to have a series, parallel and/or series-parallel connection for each of the LED to be disposed. The LED module 10 is driven by receiving the input voltage $V_{IN}$. The light emitting diode light apparatus controls the output voltage $V_{OUT}$ and the driving current $I_L$ to regulate a brightness of the LED module 10.

In an embodiment, the output capacitor 20 is connected in parallel with the LED module 10. The driving current $I_L$ drives the LED module 10 by using a voltage $V_{OUT}$ applied to both terminals of the output capacitor 20. Alternatively put, the output voltage $V_{OUT}$ corresponds to the voltage applied to both terminals of the output capacitor 20. The driving current $I_L$ drives the LED module 10, such that when the driving switching element 50 is turned on, the driving current $I_L$ corresponds to a current flowing through the driving switching element 50.

For example, the inductor 30 is connected in series with the LED module 10 and the output capacitor 20. The driving switching element 50 is connected in series with the inductor 30 and the diode 40. Also, in an embodiment, the driving switching element 50 is disposed between the inductor 30 and the trigger circuit 100. The driving switching element 50 receives a switching control signal from the trigger circuit 100 to be turned on or turned off. When the driving switching element 50 is turned on, the driving current $I_L$ flows into the sensing resistance 60 and when the driving switching element 50 is turned off, a flow of the driving current $I_L$ is cut off. Therefore, the light emitting diode light apparatus controls the output voltage $V_{OUT}$ and the driving current $I_L$ through controlling the switching control signal by using the driving switching element 50.

In one embodiment, when the driving switching element 50 is turned on, the driving current $I_L$ flows through the driving switching element 50 and the inductor 30 is charged by the driving current $I_L$. Whereas, when the driving switching element 50 is turned off, a current charged into the inductor 30 is discharged to flow into the LED module 10 through the diode 40. That is, while the driving switching element 50 is turned off, the inductor 30 operates as a current source of the driving current $I_L$.

In one embodiment, the driving switching element 50 is embodied through using a power MOSFET. When the driving switching element 50 is embodied through using the Power MOSFET, the switching control signal is transmitted to a gate terminal of the Power MOSFET through a GATE pin and the switching control signal controls the flow of the driving current $I_L$. For example, in such an embodiment, the switching control signal turns on the driving switching element 50 in a case of a positive value, such as a high level or 1, and turns off the driving switching element 50 in a case of a negative value, such as a low level or 0.

For example, the sensing resistance 60 is electrically connected to the driving switching element 50 and the trigger circuit 100. A voltage $V_{CS}$ applied to both terminals of the sensing resistance 60 is applied to the trigger circuit 100 through a CS pin. That is, the sensing resistance 60 is connected to a first terminal of the driving switching element 50 for sensing the driving current $I_L$ that passes through the driving switching element 50.

Figure 2:
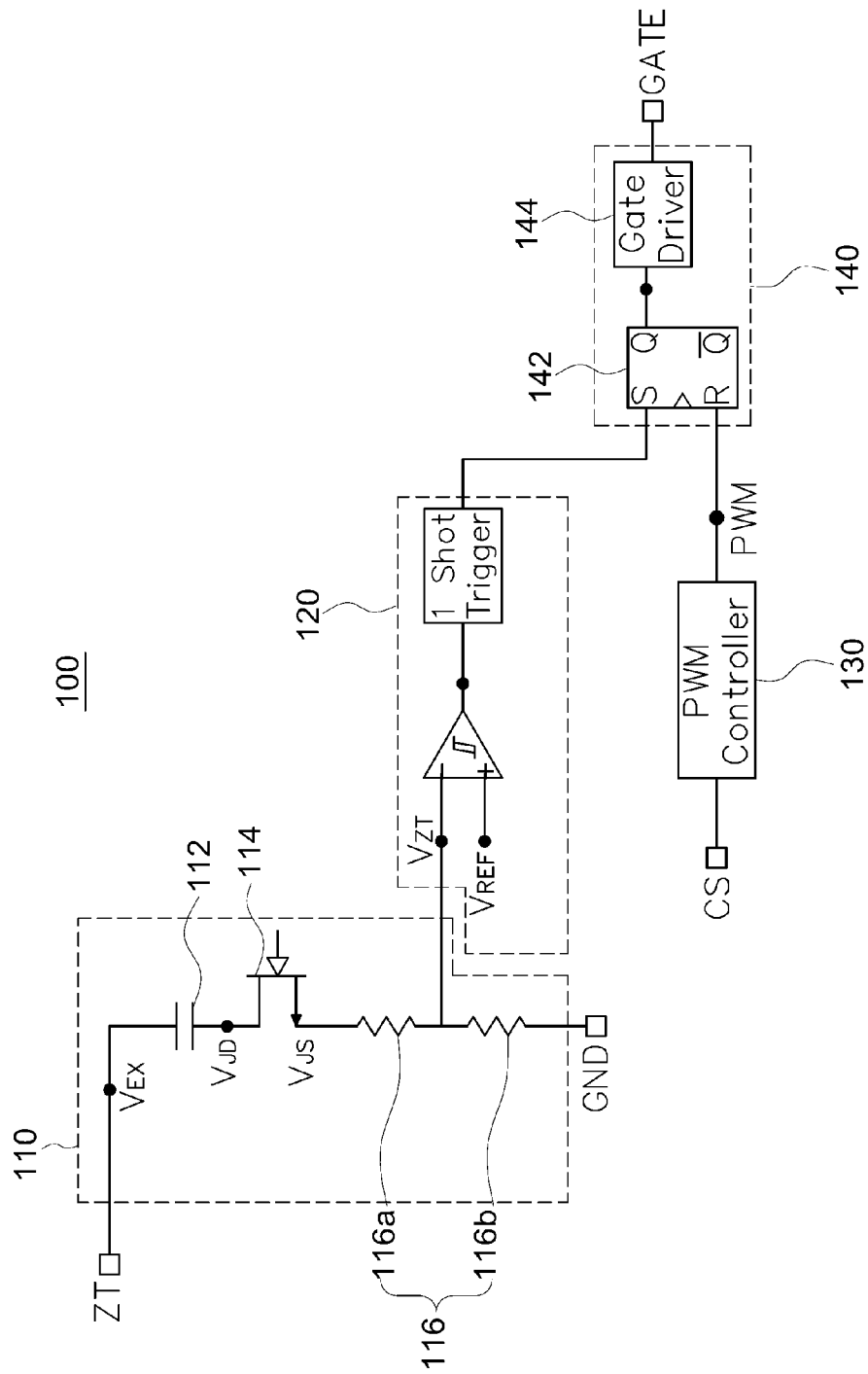
FIG. 2 is a circuit diagram illustrating components of a trigger circuit in the embodiment of FIG. 1.

FIG. 2 is a circuit diagram illustrating components of a trigger circuit in the embodiment of FIG. 1.

Referring to the embodiment of FIG. 2, the trigger circuit 100 includes a high voltage protection unit or high voltage protector 110, a switching trigger unit or switching trigger 120 and a pulse width control unit or pulse width controller 130 and a switching control unit or switching controller 140.

In this embodiment, the high voltage protector 110 includes a Metal-Insulator-Metal (MIM) capacitor 112, a high voltage protection element 114 and a voltage distribution module 116. In such an embodiment, the high voltage protector 110 scales down a first voltage $V_{JD}$ according to an internal voltage to output a second voltage $V_{JS}$ that has a level that is lower than the level of the first voltage $V_{JD}$. More specifically, the MIM capacitor 112 receives an external voltage $V_{EX}$ through a ZT pin. Here, in an embodiment, the external voltage $V_{EX}$ is associated with a voltage $V_D$ applied to a first terminal of the driving switching element 50.

In such an embodiment, at least a portion of the MIM capacitor 112 is formed to connect to an upper terminal of the high voltage protection element 114 and the MIM capacitor 112 receives the external voltage through the first terminal to provide the first voltage $V_{JD}$ to the high protection element 114 through a first terminal of the high protection element 114. For example, the MIM capacitor 112 cuts off a DC component of the external voltage $V_{EX}$ and provides as the first voltage $V_{JD}$ a voltage that corresponds to only the AC component of the external voltage $V_{EX}$ to the high protection element 114.

For example, the high voltage protection element 114 is electrically connected to a first input terminal of the switching trigger 120 and outputs a second voltage $V_{JS}$ associated with the first voltage $V_{JD}$ based on an internal voltage. In one embodiment, the high voltage protection element 114 is embodied as a Junction Field Effect Transistor (JFET). Here, the JFET has lower impedance and lower saturation voltage, a lower conduction loss during a high speed operation and a lower leakage current. Also, the JFET has excellent thermal characteristics because the JFET does not have a gate oxide element. In another embodiment, the high voltage protection element 114 is embodied as a Lateral Double-diffused MOS (LDMOS), where MOS denotes a Metal-Oxide-Semiconductor transistor. Such an LDMOS has rapid switching response and high input impedance. Accordingly, the LDMOS protects components of the trigger circuit 100 from an overvoltage and an overcurrent. In another embodiment, the high voltage protection element 114 is embodied as a High-Voltage Metal-Oxide-Semiconductor Field-Effect Transistor (HV MOSFET). The HV MOSFET protects components of the trigger circuit 100 because the HV MOSFET has a high breakdown voltage than a general MOSFET, due to its adaptation for high voltages. However, these are only examples, and other appropriate elements are used in other embodiments as the high voltage protection element 114.

In the embodiment of FIG. 2, the voltage distribution module 116 includes first and second distribution resistances 116a, 116b. For example, each of the first and second distribution resistances 116a and 116b may take the form of a resistor. The voltage distribution module 116 distributes the second voltage $V_{JS}$ to generate a third voltage $V_{ZT}$, and provides the generated third voltage $V_{ZT}$ to the first input terminal of the switching trigger unit 120. Here, the voltage distribution module 116 is connected in series with the MIM capacitor 112 and the high voltage protection element 114. In one embodiment, the voltage distribution module 116 distributes a voltage of an AC component passing through the MIM capacitor 112 and the high voltage protection element 114. For example, the third voltage $V_{ZT}$ is controlled based on a resistance value ratio of first and second distribution resistances 116a, 116b. For example, when the resistance value ratio of the first and second distribution resistances 116a, 116b is 9:1, the third voltage $V_{ZT}$ may correspond to a tenth or 10% of the second voltage $V_{JS}$. For example, the resistance value ratio of first and second distribution resistance 116a, 116b is predetermined according to an input voltage $V_{IN}$ level, a property of the MIM capacitor 112, and/or a property of the high voltage protection element 114. Because the trigger circuit 100 is operated at a lower voltage than the input voltage $V_{IN}$ received from the input power source, first and second distribution resistances 116a, 116b accordingly act to protect from an overload of the trigger circuit 100.

The switching trigger 120 detects that the second voltage $V_{JS}$ falls below a certain voltage level $V_{JS\_REF}$ in order to provide the switching trigger signal. Here, the certain voltage $V_{JS\_REF}$ may be predetermined by a designer. Also, in an embodiment, the switching trigger 120 provides the switching trigger signal to correspond to an edge clock for turning on the driving switching element 50 when the third voltage $V_{ZT}$ falls below a reference voltage $V_{REF}$. Here, when the second voltage $V_{JS}$ falls below the certain voltage $V_{JS\_REF}$, the third voltage $V_{ZT}$ accordingly falls below the reference voltage $V_{REF}$. Therefore, the third voltage $V_{ZT}$ and the reference voltage $V_{REF}$ are designed for detecting when the second $V_{JS}$ falls below certain voltage $V_{JS\_REF}$. Also, in an embodiment, the reference voltage $V_{REF}$ level is identical to a voltage level of the certain voltage $V_{JS\_REF}$ that is distributed through the voltage distribution module 116 to help ensure that the embodiment operates successfully. For example, the light emitting diode light apparatus detects a decrease of the driving current $I_L$ based on the reference voltage $V_{REF}$.

In one embodiment, the switching trigger 120 compares the third voltage $V_{ZT}$ to the reference voltage $V_{REF}$. When the driving current $I_L$ reaches a certain current value, the switching trigger 120 provides the switching trigger signal for turning on the driving switching element 50. In one embodiment, the certain current corresponds to a zero current value. When the driving current $I_L$ falls below the zero current value, a drain voltage $V_D$ of the driving switching element 50 accordingly decreases and the MIM capacitor 112 passes an AC component of the driving current $I_L$. That is, when the third voltage $V_{ZT}$ reaches the reference voltage $V_{REF}$, the switching trigger 120 provides the switching trigger signal and the switching trigger signal corresponds to one time impulse signal.

The pulse width controller 130 provides a pulse width control signal at a turn-off time of the driving switching element 50 for controlling a pulse width of the switching control signal. More specifically, when the driving switching element 50 is turned on, the pulse width controller 130 receives a sensing voltage $V_{CS}$ generated by the driving current $I_L$ passing into the driving switching element 50 through a CS pin. The pulse width controller 130 provides the pulse width control signal at the turn-off time of the driving switching element 50 based on the sensing voltage $V_{CS}$. Generally, the driving switching element 50 is turned off using a voltage mode PWM control method or using a current mode PWM control method.

In an embodiment, the switching controller 140 includes a storage element 142 and a gate driver 144. The switching controller 140 provides the switching control signal to the driving switching element 50 through a gate pin at a turn-on time or a turn-off time of the driving switching element 50. The switching controller 140 provides the switching control signal for turning on the driving switching element 50 based on the switching trigger signal. Also, the switching controller 140 provides the switching control signal for turning off the driving switching element 50 based on the pulse width control signal.

In such an embodiment, the storage element 142 is electrically connected to the switching trigger 120 and the pulse width controller 130. The storage element 142 provides an output value for turning on or turning off the driving switching element based on an output variance time of the switching trigger unit 120 or the pulse width controller 130.

The gate driver 144 receives the output value of the storage element 142 in order to output the switching control signal. For example, the switching control signal is provided to the driving switching element 50 through the gate pin. In one embodiment, the gate driver 144 amplifies an output of the storage element 142 up to a voltage required to cause the turn-on or turn-off of the driving switching element 50 and outputs the switching control signal to have a low impedance. Accordingly, the gate driver 144 rapidly provides the switching control signal to the driving switching element 50 based on the output value variance of the storage element 142.

In one embodiment, the storage element 142 is embodied using an SR latch. For example, when the storage element 142 receives the switching trigger signal through an S terminal from the switching trigger 120, the storage element 142 outputs a positive value, such as a high level or 1, accordingly turning on the driving switching element 50. By contrast, when the storage element 142 receives the pulse width control signal an R terminal from the pulse width controller 130, the storage element 142 outputs a negative value, such as a low level or 0, accordingly turning off the driving switching element 50. Thus, the gate driver 144 outputs the switching control signal based on the output value of the storage element 142.

Figure 3:
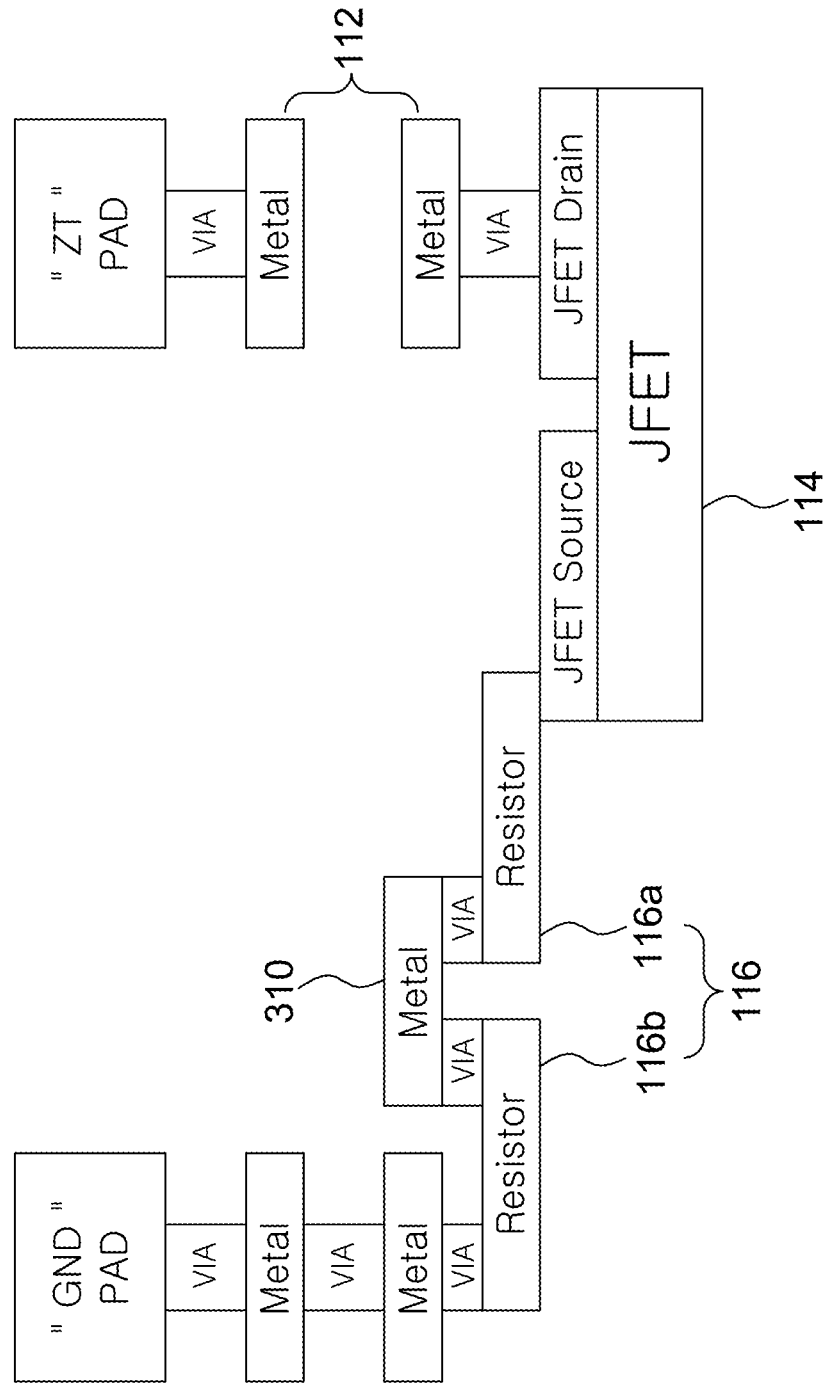
FIG. 3 is a drawing illustrating a high voltage protector of a trigger circuit in the embodiment FIG. 1.

FIG. 3 is a drawing illustrating a high voltage protector 110 of a trigger circuit in the embodiment of FIG. 1.

For example, the MIM capacitor 112 is electrically connected with the ZT pin through a ZT pad located on the upper part of the MIM capacitor 112. Because the MIM capacitor 112 uses metal for its upper and lower parts, the MIM capacitor 112 is able to decrease an impedance of a capacitor. Also, because the MIM capacitor 112 includes an insulating layer between the metal layers of its upper and lower parts, a parasitic capacitance by an internal depletion is not generated and the MIM capacitor 112 achieves a large capacitance. Therefore, the trigger circuit 100 uses the MIM capacitor 112 to rapidly perform a switching of the driving switching element 50 and accordingly minimizes device characteristic variation occurring due to a RC delay.

The high voltage protection element 114 locates at least a portion of the MIM capacitor to be located at one side of its upper part and at least a portion of the voltage distribution module to be located at the other side of its upper part. In one embodiment, the high voltage protection element 114 is embodied as a Junction Field Effect Transistor (JFET). When the high voltage protection element 114 is embodied as a JFET, at least a portion of the MIM capacitor 112 is located at the upper part of a drain terminal of the JFET, and the JFET and the MIM capacitor 112 may electrically be connected through a via. Also, in such an embodiment, at least a portion of the first distribution resistance 116a located at the upper part of a source terminal of the JFET and is electrically connected with the JFET and the voltage distribution module 116.

In an embodiment, the first and second distribution resistances 116a, 116b are electrically connected with a metal layer 310 through the via located proximate to each of the upper terminals. In an embodiment, at least a portion of the metal layer 310 is located to one side of each of the upper terminals of the first and second distribution resistances 116a, 116b. In such an embodiment, the metal layer 310 is connected to the switching trigger 120. That is, the voltage distribution module 116 distributes the second voltage $V_{JS}$ in order to generate the third voltage $V_{ZT}$ and the third voltage $V_{ZT}$ is provided to the switching trigger 120 through the metal layer 310.

The second distribution resistance 116b is connected to a GND pin through a GND pad located to one side of the upper terminal. In an embodiment, the second distribution resistance 116b and the GND pad include at least one metal layer located between the second distribution resistance 116b and the GND pad. That is, the second distribution resistance 116b locates at least a portion of the metal layer 310 connected to the switching trigger unit 120 to one side of the upper terminal and at least a portion of the GND pad to the other side of the upper terminal.

Figure 4:
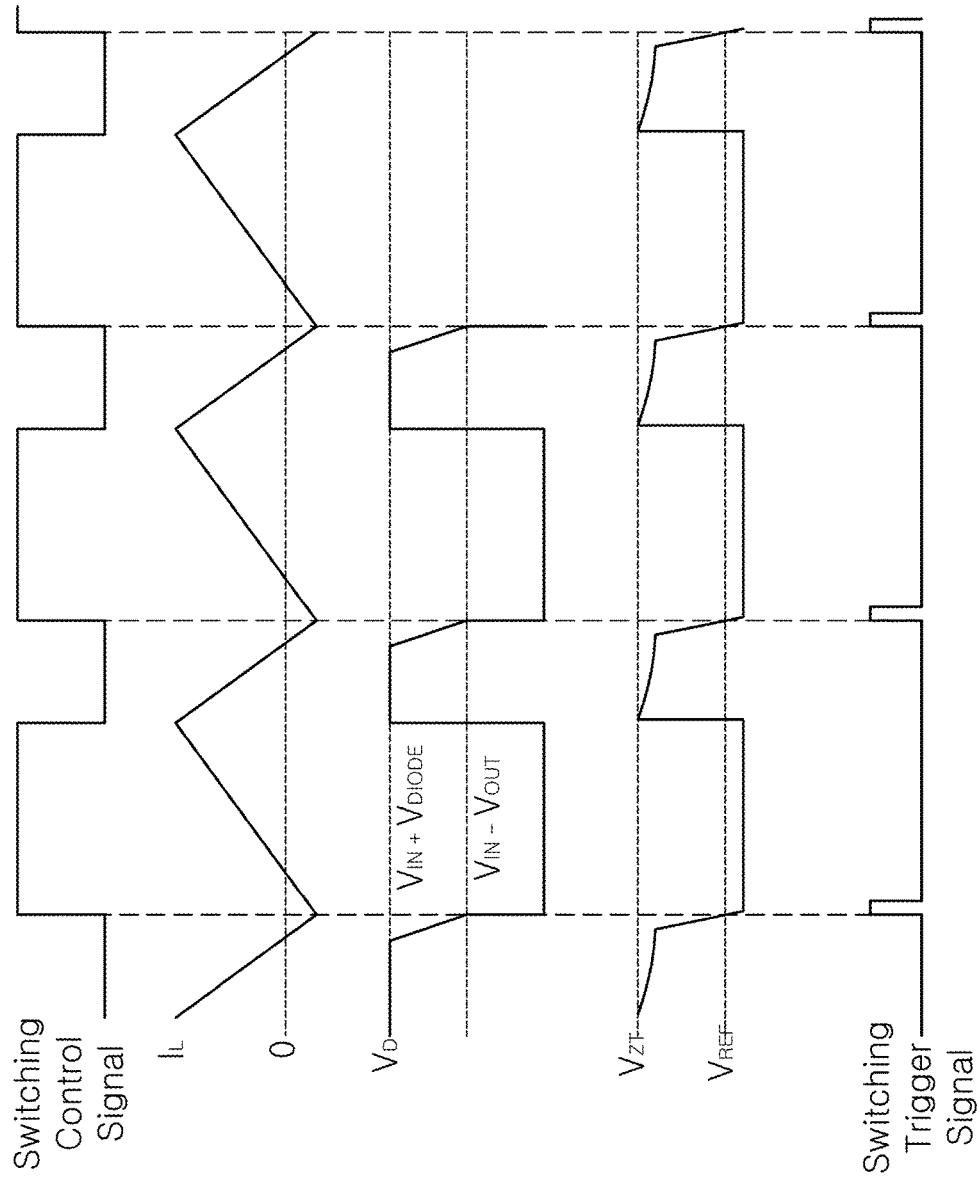
FIG. 4 is a waveform diagram illustrating an operation of a trigger circuit and light apparatus having the same in the embodiment of FIG. 1.

FIG. 4 is a waveform diagram illustrating an operation of a trigger circuit and light apparatus having the same in the embodiment of FIG. 1.

In the example of FIG. 4, when the driving switching element 50 is turned on, the driving current $I_L$ flows through the driving switching element 50 and increases with a constant slope. In one embodiment, a slope of increase of the driving current $I_L$ is proportional to a voltage applied to a terminal between the inductor 30 and the LED module 10 and is inversely proportional to an inductance L of the inductor 30. At the time at which the driving switching element 50 is turned on, a voltage of $[V_{IN}-V_{OUT}]$ is applied to the terminal between the inductor 30 and the LED module 10. That is, the slope of increase of the driving current $I_L$ corresponds to $[(V_{IN}-V_{OUT})/L]$, where L is an inductance.

However, the driving current $I_L$ flows into the LED module 10 through the diode 40 when the driving switching element 50 is turned off. That is, the driving current $I_L$ flows into the LED module 10 through the diode 40 at a voltage $V_{DIODE}$ applied to both terminals of the diode 40. When the driving switching element 50 is turned off, a current charged in the inductor 30 is discharged. Accordingly, the driving current $I_L$ decreases with a constant slope.

In one embodiment, a slope of decrease of the driving current $I_L$ is proportional to the voltage applied to both terminals of the LED module 10 and is inversely proportional to the inductance of the inductor 30. For example, in the embodiment of FIG. 1, a voltage of $[V_{OUT}]$ is applied to both terminals of the LED module 10. That is, the slope of decrease of the driving current $I_L$ corresponds to $[-V_{OUT}/L]$, where L is an inductance. More specifically, when the driving current $I_L$ reaches a zero value, the voltage applied to both terminals of the inductor 30 also has a zero value. Thus, the driving current $I_L$ may continuously decrease after reaching to a zero current value and reaches a minimum peak level at the turn-on time of the driving switching element 50.

In one embodiment, when the driving switching element 50 is turned off, the drain voltage VD maintain a constant voltage of $[V_{IN}+V_{DIODE}]$ and when the driving current $I_L$ falls below the certain current or a zero current value, the drain current $V_D$ may rapidly decrease. When the drain voltage $V_D$ rapidly decreases to be identical to the voltage $V_{IN}-V_{OUT}$ that is applied to the terminal between the inductor 30 and the LED module 10, the driving switching element 50 is turned on and the driving current $I_L$ increases with the constant slope.

The switching trigger 120 compares the third voltage $V_{ZT}$ and the reference voltage $V_{REF}$ to provide the switching trigger signal. More specifically, when the driving current $I_L$ falls below the certain current or a zero current value, the third voltage $V_{ZT}$ rapidly decreases and when the third voltage $V_{ZT}$ reaches the reference voltage $V_{REF}$, the switching trigger 120 provides the switching trigger signal. Here, in an embodiment, the switching trigger signal corresponds to an edge clock signal for turning on the driving switching element 50.

Accordingly, the third voltage $V_{ZT}$ instantaneously increases at the turn-off time point of the driving switching element 50 to reach a pinch level. Such a pinch level is a voltage level at which the electric current is impeded or switched off completely through the driving switching element 50. When the third voltage $V_{ZT}$ reaches the pinch level, the third voltage $V_{ZT}$ then gently decreases based on the device characteristics of the high voltage protector 110.

Figure 5:
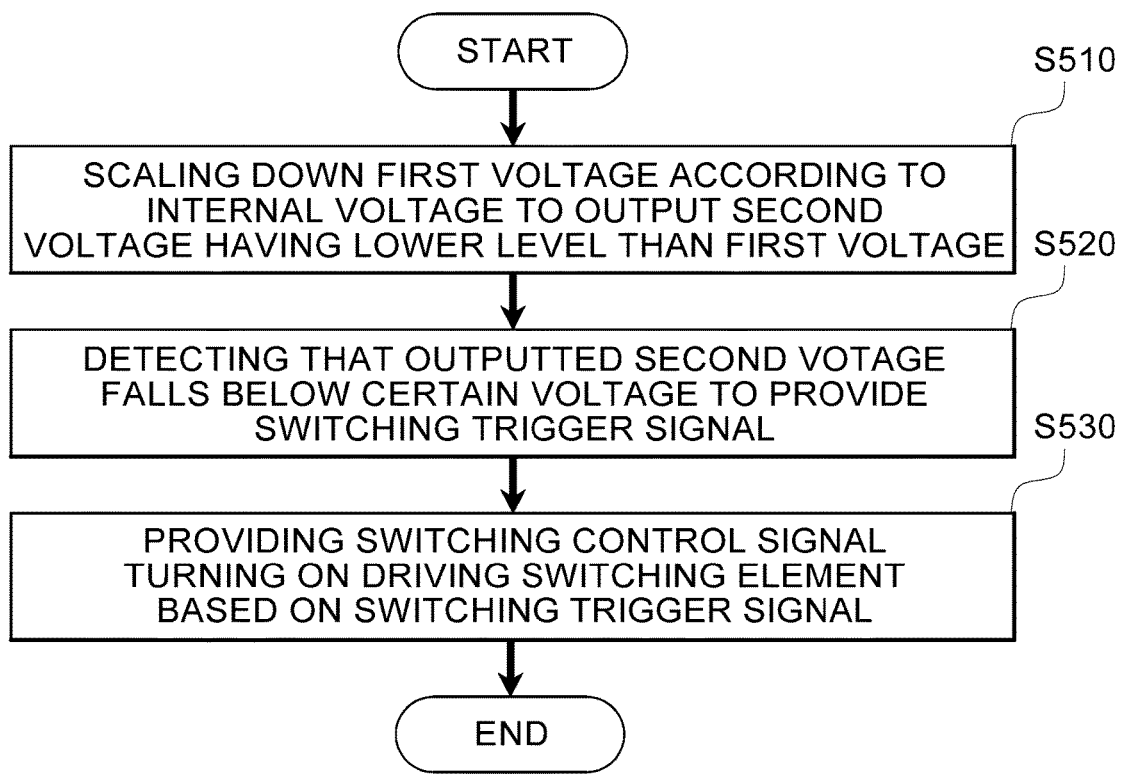
FIG. 5 is a flowchart illustrating a driving method of a trigger circuit and light apparatus having the same in the embodiment of FIG. 1.

FIG. 5 is a flow chart illustrating a driving method of a trigger circuit and light apparatus having the same in the embodiment of FIG. 1.

In step S510, the high voltage protector 110 scales down the first voltage $V_{JD}$ according to the internal voltage to output the second voltage $V_{JS}$ that is lower than the first voltage $V_{JD}$ level. In further detail, in an embodiment, the MIM capacitor 112 receives the external voltage $V_{EX}$ through the ZT pin. Here, the external voltage $V_{EX}$ is connected with the voltage $V_D$ applied to the first terminal of the driving switching element 50. The MIM capacitor 112 provides the first voltage $V_{JD}$ to the high voltage protection element 114 based on the received external voltage $V_{EX}$. The high voltage protection element 114 accordingly outputs the second voltage $V_{JS}$ associated with the first voltage $V_{JD}$ based on the internal voltage. In one embodiment, the high voltage protection element 114 is embodied as a JFET, an LDMOS, or an HV MOSFET, or another appropriate alternative element, as discussed further, above. The voltage distribution module 116 distributes the second voltage $V_{JS}$ to generate the third voltage $V_{ZT}$ and provides the third voltage $V_{ZT}$ to the first input terminal of the switching trigger 120.

In step S520, the switching trigger 120 detects that the outputted second voltage $V_{JS}$ falls below the certain voltage $V_{JS\_REF}$ to provide the switching trigger signal. In further detail, the switching trigger 120 provides the switching trigger signal corresponding to the edge clock signal for turning on the driving switching element 50 when the third voltage $V_{ZT}$ falls below the reference voltage $V_{REF}$. Herein, when the second voltage $V_{JS}$ falls below the certain voltage $V_{JS\_REF}$, the third voltage $V_{ZT}$ falls below the reference voltage $V_{REF}$. Therefore, the third voltage $V_{ZT}$ and the reference voltage $V_{REF}$ are designed for detecting that the second voltage $V_{JS}$ falls below the certain voltage $V_{JS\_REF}$. Also, in an embodiment, the reference voltage $V_{REF}$ level is identical to the level that is distributed by certain voltage $V_{JS\_REF}$ through the voltage distribution module 116.

Also, in an embodiment, the pulse width controller 130 provides the pulse width control signal at the turn-off time of the driving switching element 50 for controlling the pulse width of the switching control signal. In further detail, in such an embodiment, when the driving switching element 50 is turned on, the pulse width controller 130 receives the sensing voltage $V_{CS}$ generated from the driving current $I_L$ passing into the driving switching element 50 through the CS pin. The pulse width controller 130 provides the pulse width control signal at the turn-off time of the driving switching element 50 based on the sensing voltage $V_{CS}$.

In step S530, the switching controller 140 provides the switching control signal to the driving switching element 50 at the turn-on or turn-off time of the driving switching element 50 through the gate pin. For example, the switching controller 140 provides the switching control signal for turning on the driving switching element 50 based on the switching trigger signal. Also, the switching controller 140 provides the switching control signal for turning off the driving switching element 50 based on the pulse width control signal.

Therefore, the trigger circuit 100 and light apparatus having the trigger circuit 100 use the MIM (Metal-Insulator-Metal) capacitor and the high voltage protection element as described above to protect the internal elements of the trigger circuit 100 from a high voltage. For example, the trigger circuit 100 uses the MIM (Metal-Insulator-Metal) capacitor and the high voltage protection element to detect the time at which the the driving current reaches a zero value and provide a way to protect the trigger circuit 100 while improving cost competitiveness.

The apparatuses, units, modules, devices, and other components illustrated in FIGS. 1-5 that perform the operations described herein with respect to FIGS. 1-5 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-5. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-5 that perform the operations described herein with respect to FIGS. 1-5 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A trigger circuit, comprising:
   a high voltage protector configured to scale down a first voltage according to an internal voltage to output a second voltage having a lower level than the first voltage;
   a switching trigger configured to detect that the outputted second voltage falls below a certain voltage level to provide a switching trigger signal; and
   a switching controller configured to provide a switching control signal for turning on a driving switching element in response to receiving the switching trigger signal.

2. The trigger circuit of claim 1, wherein the high voltage protector comprises a high voltage protection element configured to be electrically connected with a first input terminal of the switching trigger and configured to output the second voltage based on the internal voltage.

3. The trigger circuit of claim 2, wherein the high voltage protector comprises a Metal-Insulator-Metal (MIM) capacitor configured to receive an external voltage through a terminal to provide the first voltage to the high voltage protection element through another terminal, wherein at least a portion of the MIM capacitor is formed on an upper part of the high voltage protection element.

4. The trigger circuit of claim 3, wherein the MIM capacitor cuts off a direct current (DC) component of the external voltage and provides the first voltage to correspond to an alternating current (AC) component of the external voltage to the high voltage protection element.

5. The trigger circuit of claim 3, wherein the high voltage protector comprises a voltage distribution module configured to distribute the second voltage to generate a third voltage and configured to provide the generated third voltage to the first input terminal of the switching trigger, wherein at least a portion of the voltage distribution module is formed on the upper part of the high voltage protection element.

6. The trigger circuit of claim 5, wherein the high voltage protection element locates at least a portion of the MIM capacitor to one side of the upper part of the high voltage protection element and at least a portion of the voltage distribution module to the other side of the high voltage protection element.

7. The trigger circuit of claim 5, wherein the switching trigger provides the switching trigger signal to correspond to an edge clock to turn on the driving switching element in response to the third voltage falling below a reference voltage.

8. The trigger circuit of claim 1, further comprising:
   a pulse width controller configured to provide a pulse width control signal for controlling a pulse width of the switching control signal at a turn-off point of the driving switching element.

9. The trigger circuit of claim 8, wherein the switching controller provides the switching control signal for turning off the driving switching element based on the pulse width control signal.

10. The trigger circuit of claim 9, wherein the driving switching element is turned off using a voltage mode pulse-width modulation (PWM) control method or a current mode PWM control method.

11. The trigger circuit of claim 8, wherein the switching controller comprises a storage element configured to provide an output value for turning on or turning off the driving switching element based on an output variance time of the switching trigger or the pulse width controller.

12. A light emitting diode light apparatus, comprising:
   a Light Emitting Diode (LED) module;
   an inductor connected in series to the LED module;
   a driving switching element connected in series to the inductor; and
   a trigger circuit configured to scale down an external voltage generated through a driving current driving the LED module to turn on the driving switching element when the scaled down voltage falls below a certain voltage,
   wherein the trigger circuit comprises:
   a high voltage protector configured to scale down a first voltage according to an internal voltage to output a second voltage lower than the first voltage level;
   a switching trigger configured to detect that the outputted second voltage falls below a certain voltage to provide a switching trigger signal; and a switching controller configured to provide a switching control signal for turning on a driving switching element based on the switching trigger signal.

13. A driving method of a trigger circuit, comprising:

scaling down a first voltage according to an internal voltage to output a second voltage having a lower level than the first voltage;

detecting that the outputted second voltage falls below a certain voltage level to provide a switching trigger signal; and providing a switching control signal for turning on a driving switching element based on the switching trigger signal.

14. The driving method of claim 13, further comprising:

providing a pulse width control signal for controlling a pulse width of the switching control signal at a turn-off point of the driving switching element.

15. The driving method of claim 14, wherein the switching control signal for turning off the driving switching element is provided based on the pulse width control signal.

16. The driving method of claim 15, wherein the driving switching element is turned off using a voltage mode pulse-width modulation (PWM) control method or a current mode PWM control method.

* * * * *